(12) United States Patent
Wang et al.

(10) Patent No.: US 11,102,384 B2
(45) Date of Patent: Aug. 24, 2021

(54) CAMERA SUBSTRATE ASSEMBLY, CAMERA MODULE, AND TERMINAL DEVICE

(71) Applicant: Huawei Technologies Co., Ltd., Shenzhen (CN)

(72) Inventors: Guanghai Wang, Shenzhen (CN); Cunying Li, Shenzhen (CN); Zhendong Luo, Shenzhen (CN); Qingshan Tian, Shenzhen (CN); Jianwen Wang, Shenzhen (CN); Sheng Li, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/331,869

(22) PCT Filed: Jan. 13, 2017

(86) PCT No.: PCT/CN2017/071024
§ 371 (c)(1),
(2) Date: Mar. 8, 2019

(87) PCT Pub. No.: WO2018/120299
PCT Pub. Date: Jul. 5, 2018

(65) Prior Publication Data
US 2019/0356822 A1 Nov. 21, 2019

(30) Foreign Application Priority Data
Dec. 27, 2016 (CN) .......................... 201611225458.2

(51) Int. Cl.
*H04N 5/225* (2006.01)
*H05K 3/30* (2006.01)

(52) U.S. Cl.
CPC .......... *H04N 5/2253* (2013.01); *H04N 5/2252* (2013.01); *H05K 3/301* (2013.01); *H04N 5/2258* (2013.01)

(58) Field of Classification Search
CPC .. H04N 5/2253; H04N 5/2252; H04N 5/2258; H04N 5/225; H04N 5/2251; H05K 3/301
See application file for complete search history.

(56) References Cited

U.S. PATENT DOCUMENTS

2003/0057426 A1* 3/2003 Miyazaki .......... H01L 27/14618
257/88
2007/0117423 A1 5/2007 Kim et al.
(Continued)

FOREIGN PATENT DOCUMENTS

CN 101035199 A 9/2007
CN 101124857 A 2/2008
(Continued)

OTHER PUBLICATIONS

Machine Translation and Abstract of Chinese Publication No. CN205195817, Apr. 27, 2016, 9 pages.
(Continued)

*Primary Examiner* — Albert H Cutler
(74) *Attorney, Agent, or Firm* — Conley Rose, P.C.

(57) ABSTRACT

A camera substrate assembly, a camera apparatus, and a terminal device, where the camera substrate assembly includes a rigid support plate and a printed circuit board laminated, where at least two mounting holes for accommodating camera chips are disposed on the printed circuit board, the rigid support plate has mounting surfaces facing the mounting holes respectively and are configured to support the camera chips, strength of the rigid support plate is greater than strength of the printed circuit board, and flatness of the mounting surfaces is less than a specified threshold. The mounting holes disposed on the printed circuit board (Continued)

and the mounting surfaces disposed on the rigid support plate are used to support cameras. This avoids impact of warpage on camera mounting when the printed circuit board and a flexible circuit board are laminated, and improves flatness after camera mounting.

20 Claims, 3 Drawing Sheets

(56) References Cited

U.S. PATENT DOCUMENTS

| | | | |
|---|---|---|---|
| 2007/0278647 | A1 | 12/2007 | Morita |
| 2010/0103296 | A1* | 4/2010 | Nakagiri ............ H01L 27/14618 348/294 |
| 2014/0049686 | A1 | 2/2014 | Chen |
| 2015/0109422 | A1 | 4/2015 | Weiss |
| 2015/0264290 | A1* | 9/2015 | Happoya .............. H04N 5/2253 348/373 |
| 2015/0326768 | A1 | 11/2015 | Kim et al. |
| 2015/0358605 | A1 | 12/2015 | Müller et al. |
| 2017/0012069 | A1 | 1/2017 | Rudmann et al. |
| 2017/0134624 | A1 | 5/2017 | Zhang et al. |
| 2017/0244877 | A1* | 8/2017 | Wang ................... H04N 5/2258 |
| 2018/0088296 | A1* | 3/2018 | Kohama ............... H04N 5/2253 |
| 2018/0196219 | A1* | 7/2018 | O .............................. G02B 7/09 |
| 2019/0267416 | A1* | 8/2019 | Kohama ................ H04N 5/225 |

FOREIGN PATENT DOCUMENTS

| | | |
|---|---|---|
| CN | 103163617 A | 6/2013 |
| CN | 103841300 A | 6/2014 |
| CN | 104580855 A | 4/2015 |
| CN | 204332959 U * | 5/2015 |
| CN | 104954634 A | 9/2015 |
| CN | 205195817 U | 4/2016 |
| CN | 205430411 U | 8/2016 |
| CN | 205545558 U | 8/2016 |
| CN | 106104804 A | 11/2016 |
| DE | 102013102820 A1 | 9/2014 |

OTHER PUBLICATIONS

Machine Translation and Abstract of Chinese Publication No. CN205545558, Aug. 31, 2016, 17 pages.
Foreign Communication From a Counterpart Application, European Application No. 17889193.3, Extended European Search Report dated Jun. 18, 2019, 7 pages.
Machine Translation and Abstract of Chinese Publication No. CN101035199, Sep. 12, 2007, 7 pages.
Machine Translation and Abstract of Chinese Publication No. CN103163617, Jun. 19, 2013, 7 pages.
Machine Translation and Abstract of Chinese Publication No. CN103841300, Jun. 4, 2014, 13 pages.
Machine Translation and Abstract of Chinese Publication No. CN104580855, Apr. 29, 2015, 8 pages.
Foreign Communication From a Counterpart Application, PCT Application No. PCT/CN2017/071024, English Translation of International Search Report dated Aug. 30, 2017, 2 pages.

* cited by examiner

CAMERA SUBSTRATE ASSEMBLY, CAMERA MODULE, AND TERMINAL DEVICE

This application is a U.S. National Stage of International Patent Application No. PCT/CN2017/071024 filed on Jan. 13, 2017, which claims priority to Chinese Patent Application No. 201611225458.2 filed on Dec. 27, 2016. Both of the aforementioned applications are hereby incorporated by reference in their entireties.

TECHNICAL FIELD

The present invention relates to the field of shooting device technologies, and in particular, to a camera substrate assembly, a camera module, and a terminal device.

BACKGROUND

Due to rapid popularization of smartphones, camera application develops from single-camera to dual-camera and multi-camera. For dual-camera module manufacturing alone, there are currently two mainstream production forms: a co-substrate dual-camera module and a co-bracket dual-camera module.

The co-substrate dual-camera module means that substrate circuits of two cameras are designed on a same printed circuit board, and then other assemblies are packaged layer by layer by using the common substrate as a base, to complete manufacturing a dual-camera module.

Entire system assembly of the dual-camera module requires that top surfaces of two modules (upper surfaces of motors or upper surfaces of outer protective brackets) be flush with each other. When existing printed circuit board substrates on a same surface meet this assembly requirement, other mechanical parts of a left module and a right module need to be approximately of a same size, for example, motors of a same height, chips (sensors) of a same thickness, lenses with a same field of view, and protective brackets of a same thickness.

The dual-camera module brings a consumer new visual experience. For example, application of a big wide angle or a high depth of field offers a sharper picture with a clearer edge, bokeh, stereo experience, and the like. Similarly, to meet these requirements, the market imposes corresponding requirements on the dual-camera module, for example: 1. a change in different fields of view of a left lens and a right lens (one has a wide angle, and the other has a high depth of field); 2. chips in different thicknesses (chips of different vendors are different in thickness). Therefore, a limitation of the existing co-substrate dual-camera module cannot adapt to these changes, and innovation is required to change this reality.

Most existing co-substrate dual-camera substrates use thermo-compression bonding of a printed circuit board and an FPC (Flexible Printed Circuit, flexible circuit board). However, this method has the following problems:

1. Neither a body of a rigid printed circuit board nor a body of a flexible circuit board has high (>30 μm) flatness (warpage). Warpage (warpage>50 μm) easily occurs on the rigid printed circuit board during thermo-compression bonding.

2. Low flatness of a substrate may lead to low flatness (tilt>20 μm) of chip and substrate lamination. The tilt may cause low AA (active alignment, active alignment) efficiency (note: a theoretically optimal imaging surface is a sensor surface because a flatness change may cause a long period of time for searching for an optimal imaging surface and when flatness exceeds an upper limit (this upper limit is set in a product test specification), the optimal imaging surface cannot be found, and AA fails) and poor SFR (spatial frequency response, spatial frequency response) performance in a subsequent assembly test process.

SUMMARY

This application provides a camera substrate assembly.

The camera substrate assembly provided in this application includes a rigid support plate and a printed circuit board that are laminated, where at least two mounting holes for accommodating camera chips are disposed on the printed circuit board, the rigid support plate has mounting surfaces that face the mounting holes respectively and that are configured to support the camera chips, strength of the rigid support plate is greater than strength of the printed circuit board, and flatness of the mounting surfaces is less than a specified threshold.

In the embodiment, the mounting holes disposed on the printed circuit board and the mounting surfaces disposed on the rigid support plate are used to support the camera chips. This avoids impact of warpage on camera mounting when the printed circuit board and a flexible circuit board are laminated, and improves flatness after camera chip mounting, thereby improving a shooting effect of a camera module.

In a specific implementation, there is a height difference between mounting surfaces facing different mounting holes, so that the substrate assembly can be applied to different scenarios. Heights of the mounting surfaces are adjusted to adapt to a change in fields of view of different lenses and a change in thicknesses of different camera chips.

At least one groove is disposed on the rigid support plate, and a bottom surface of each groove is one of the mounting surfaces. Mounting surfaces are disposed at different heights by forming a groove on the rigid support plate. In an optional solution, a quantity of grooves may be in a one-to-one correspondence with a quantity of mounting holes, or may be less than the quantity of mounting holes. For example, two grooves may be used when two mounting holes are used. Mounting surfaces are disposed at different heights by disposing grooves of different depths. In a specific disposition, the grooves may be disposed on the rigid support plate in a cutting manner or another common preparation manner.

In a specific implementation solution, there is one groove, the groove communicates with one of the at least two mounting holes, and a mounting surface that is of the rigid support plate and that faces another one of the at least two mounting holes is flush with a surface that is of the rigid support plate and that faces the printed circuit board. In other words, different heights of the mounting surfaces are formed by disposing the groove to adapt to a change in fields of view of different lenses and a change in thicknesses of different camera chips.

In a specific implementation, at least one boss is disposed on the rigid support plate, and a top surface of each boss is one of the mounting surfaces. In other words, mounting surfaces are disposed at different heights by disposing a boss on the rigid support plate. A quantity of bosses may be the same as or different from a quantity of mounting holes, and may be specifically set based on an actual situation. Bosses are disposed at different heights to adapt to a change in fields of view of different lenses and a change in thicknesses of different camera chips.

In a specific implementation, when only a boss structure is disposed on the rigid support plate, there is one boss and the boss is inserted into one of the at least two mounting holes, and a mounting surface that is of the rigid support plate and that faces another one of the at least two mounting holes is flush with a surface that is of the rigid support plate and that faces the printed circuit board. In other words, in the used mounting surfaces, one mounting surface is a top surface of the boss, and the other mounting surface is the surface of the rigid support plate, so that the mounting surfaces are disposed at different heights.

In a specific implementation solution, the boss and the rigid support plate are an integrated structure. The integrated structure is used to improve strength of the entire structure. In an actual disposition, the boss structure is formed on the rigid support plate in a cutting manner or a grinding manner.

In a specific implementation solution, the rigid support plate is a metal support plate. The metal support plate has better support strength, and heat conduction performance of a metal material is better than heat conduction performance of a material of the printed circuit board. A heat dissipation effect brought when the metal material is directly bonded to the camera chips is better than a heat dissipation effect brought when the camera chips are bonded to the printed circuit board. In addition, flatness of the metal material processed by a grinding machine is far better than flatness of the printed circuit board.

In a specific implementation solution, the metal support plate is a steel plate or an alloy plate.

In a specific implementation solution, the camera substrate assembly further includes a flexible circuit board that is signal-connected to the printed circuit board, where the flexible circuit board is signal-connected to a connector, and the flexible circuit board is disposed between two plates of the printed circuit board. In this case, the mounting holes pass through the flexible circuit board.

In a specific implementation solution, the specified threshold is 5-10 µm. Flatness of the metal material processed by the grinding machine can reach 5-10 µm, and is far better than 30-µm flatness of the printed circuit board.

This application further provides a camera module. The camera module includes the camera substrate assembly according to any one of the foregoing implementations, and further includes a camera chip disposed on a mounting surface in each mounting hole, where each camera chip is signal-connected to the printed circuit board, and the camera module further includes:

a lens mount fixedly connected to the printed circuit board, where a light filter is disposed on the lens mount; and a lens and a drive motor that drives the lens to zoom in or zoom out, where an optical axis of the lens and an axis of the light filter are coaxial.

In the embodiment, mounting holes disposed on the printed circuit board and mounting surfaces disposed on a rigid support plate are used to support cameras. This avoids impact of warpage on camera mounting when the printed circuit board and a flexible circuit board are laminated, and improves flatness after camera mounting, thereby improving a shooting effect of the camera module.

In a specific implementation solution, each camera chip is signal-connected to the printed circuit board by using a metallic wire. The camera chip is directly bonded to and packaged on a structure of a metal support plate. A surface of the camera chip is below or is flush with a surface of the printed circuit board. Metallic wire bonding for connection from the camera chip to the printed circuit board can lower an arc of the metallic wire, thereby reducing a risk that a lens mount touches the metallic wire in a subsequent packaging process.

This application further provides a terminal device. The terminal device includes the foregoing camera module.

In the embodiment, mounting holes disposed on a printed circuit board and mounting surfaces disposed on a rigid support plate are used to support cameras. This avoids impact of warpage on camera mounting when the printed circuit board and a flexible circuit board are laminated, and improves flatness after camera mounting, thereby improving a shooting effect of the camera module.

DESCRIPTION OF EMBODIMENTS

The following further describes this application with reference to the accompanying drawings.

Figure 1:
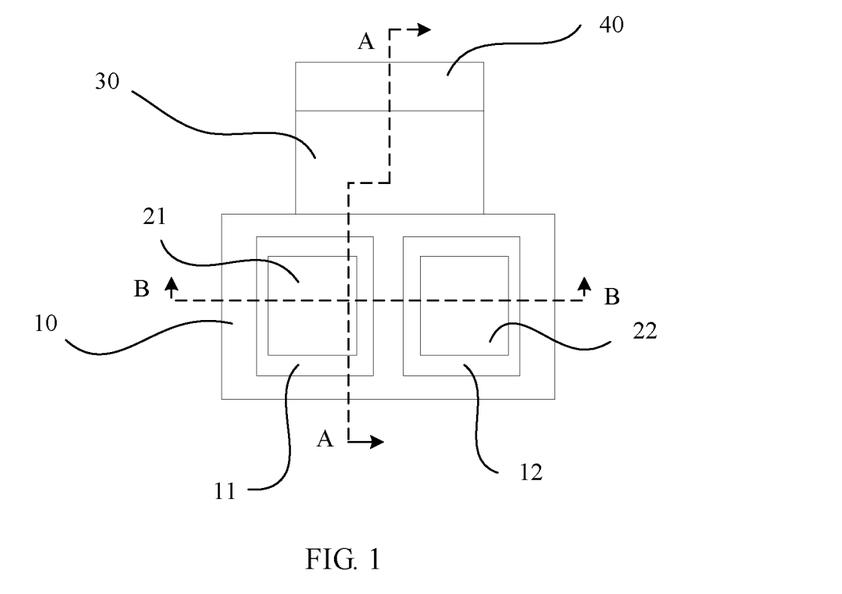
FIG. 1 is a top view of a camera substrate assembly according to this application.
Figure 2:
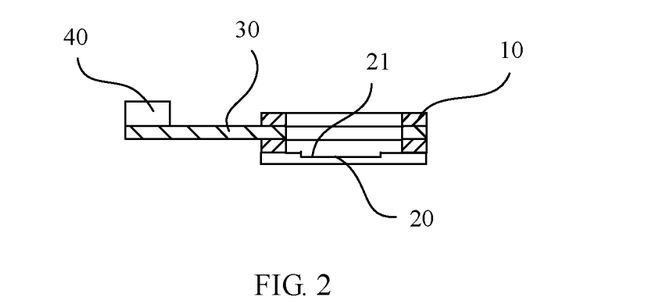
FIG. 2 is a cutaway drawing of A-A in FIG. 1.
Figure 3:
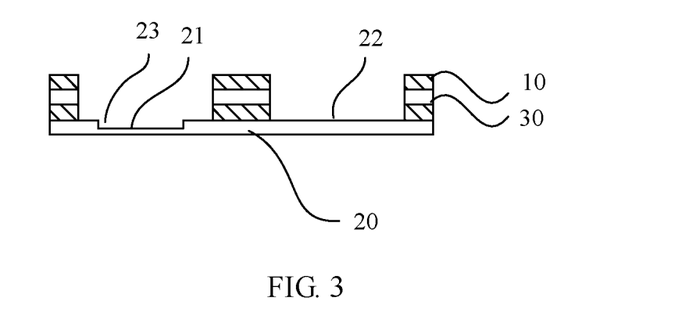
FIG. 3 is a cutaway drawing of B-B in FIG. 1.

As shown in FIG. 1, FIG. 2, and FIG. 3, is a top view of a camera substrate assembly according to an embodiment of this application, and FIG. 2 and FIG. 3 are cutaway drawings of different angles of a camera substrate assembly according to an embodiment of this application.

The camera substrate assembly provided in this embodiment of this application includes a printed circuit board 10 and a rigid support plate 20. The printed circuit board 10 and a flexible circuit board 30 are laminated. At least two mounting holes for housing camera chips are disposed on the printed circuit board 10. The mounting holes are configured to mount camera chips of cameras. The camera substrate assembly shown in FIG. 1 has two mounting holes: a first mounting hole 11 and a second mounting hole 12. The first mounting hole 11 and the second mounting hole 12 are disposed along a length direction of the printed circuit board 10. (When a direction in which the camera substrate assembly shown in FIG. 1 is placed is used as a reference direction, a horizontal direction is the length direction of the printed circuit board 10.)

In this embodiment of this application, the rigid support plate 20 and the printed circuit board 10 are laminated. Therefore, one end of a mounting hole on the printed circuit board 10 is blocked by the rigid support plate 20, and mounting surfaces that face the mounting holes respectively and that are configured to support the camera chips are formed on the rigid support plate 20. In other words, each mounting hole is corresponding to a mounting surface on the rigid support plate 20. The mounting surfaces may be surfaces with different structures. In a specific disposition, different structures may be formed on the rigid support plate 20 based on an actual requirement to form mounting surfaces meeting different height requirements. When the mounting surfaces are specifically disposed, flatness of the mounting surfaces is less than a specified threshold. Specifically, the specified threshold may be 5-10 µm, such as 5 µm, 6 µm, 7 µm, 8 µm, 9 µm, 10 µm, or another value ranging from 5 µm to 10 µm. This flatness is far better than 30-µm flatness of the printed circuit board 10. The specified threshold allows the mounting surfaces for the camera chips to have good flatness, thereby improving flatness when the camera chips are disposed, and effectively improving a shooting effect. In addition, strength of the rigid support plate 20 is greater than strength of the printed circuit board 10, thereby providing better strength support for the entire substrate assembly.

In addition, continuing to refer to FIG. 1, FIG. 2, and FIG. 3, the camera substrate assembly disclosed in this application further includes the flexible circuit board 30. The flexible circuit board 30 is signal-connected to the printed circuit board 10, and the flexible circuit board 30 is connected to a connector 40 at an end far away from the printed circuit board 10. The connector 40 is configured to connect to a mainboard of a terminal device. In a specific implementation, the flexible circuit board 30 is disposed between two plates of the printed circuit board 10. In this case, the mounting holes on the printed circuit board 10 pass through the flexible circuit board 30. To be specific, side walls of the mounting holes are formed by the two plates of the printed circuit board 10 and the flexible circuit board 30.

To better understand a structure and a principle of the camera substrate assembly provided in this embodiment, the following describes the camera substrate assembly in detail with reference to specific accompanying drawings.

Embodiment 1

Continuing to refer to FIG. 1, FIG. 2, and FIG. 3, a substrate assembly provided in this embodiment includes a printed circuit board 10, a flexible circuit board 30, a connector 40, and a rigid support plate 20. The flexible circuit board 30, the printed circuit board 10, and the rigid support plate 20 are laminated. The flexible circuit board 30 is disposed between two plates of the printed circuit board 10. The rigid support plate 20 is disposed on one side of the printed circuit board 10 and blocks mounting holes on the printed circuit board 10. In this embodiment, there are two mounting holes: a first mounting hole 11 and a second mounting hole 12. Correspondingly, there are two mounting surfaces on the rigid support plate 20: a first mounting surface 21 and a second mounting surface 22.

In this embodiment of this application, at least one groove is disposed on the rigid support plate 20, and a bottom surface of each groove is one of the mounting surfaces. Specifically, a quantity of grooves may vary. One groove may be used, or each mounting hole may be corresponding to one groove. A specific case may depend on a quantity of and heights of actually required mounting surfaces. In other words, mounting surfaces are disposed at different heights by forming a groove on the rigid support plate 20.

For example, in this embodiment, the first mounting hole 11 is corresponding to a groove. A bottom surface of the groove is the first mounting surface 21, and is configured to support a camera chip. The groove may be formed on the rigid support plate 20 in an etching manner or a cutting manner. The second mounting hole 12 is corresponding to a surface of the rigid support plate 20. To be specific, a mounting surface corresponding to the second mounting hole 12 is flush with a surface that is of the rigid support plate 20 and that faces the second mounting hole 12.

Figure 4:
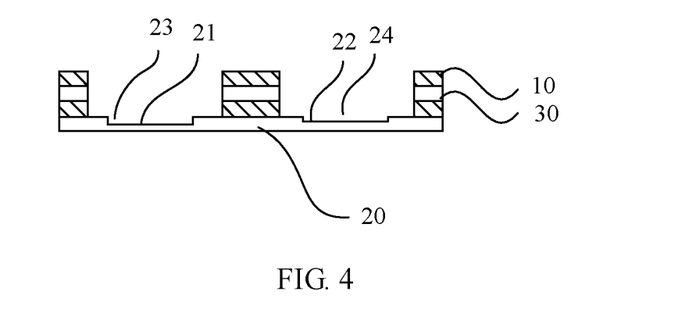
FIG. 4 is a cutaway drawing of a camera substrate assembly according to this application.

Alternatively, as shown in FIG. 4, the first mounting hole 11 and the second mounting hole 12 are corresponding to two grooves (a first groove 23 and a second groove 24 respectively). A depth of the first groove 23 is different from a depth of the second groove 24. In other words, a height of the first mounting surface 21 is different from a height of the second mounting surface 22. The mounting surfaces are adjusted by adjusting the depths of the grooves. This adapts to a change in fields of view of different lenses 60 and a change in thicknesses of different camera chips.

It should be understood that, in this embodiment of this application, when there are a plurality of mounting holes, for example, there are three, four, or five mounting holes, a quantity of corresponding grooves on the rigid support plate 20 may be correspondingly adjusted. To be specific, when a height difference between the mounting surfaces needs to be adjusted, a corresponding groove may be disposed on the rigid support plate 20 based on an actual requirement.

In addition, in a specific implementation solution, the rigid support plate 20 is a metal support plate, such as a steel plate, an alloy plate, an aluminum plate, an iron plate, or another common metal plate, to ensure structure strength of the rigid support plate 20. The metal support plate has better support strength. Heat conduction performance of a metal material is better than heat conduction performance of a material of the printed circuit board 10. A heat dissipation effect brought when the metal material is directly bonded to the camera chips is better than a heat dissipation effect brought when the camera chips are bonded to the printed circuit board 10. In addition, flatness of the metal material processed by a grinding machine is far better than flatness of the printed circuit board 10. For example, the flatness of the metal material processed by the grinding machine can reach 5-10 µm, and is far better than 30-µm flatness of the printed circuit board 10.

Embodiment 2

Figure 5:
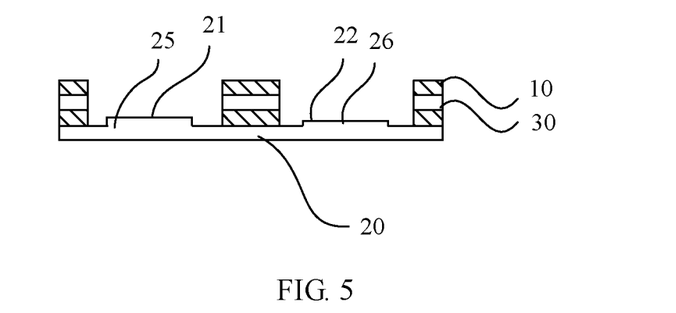
FIG. 5 is a cutaway drawing of a camera substrate assembly according to this application.

As shown in FIG. 5, FIG. 5 is a cutaway drawing of a camera substrate assembly according to this embodiment. In this embodiment of this application, structures of a printed circuit board 10, a flexible circuit board 30, and a connector 40 on the camera substrate assembly are the same as those in Embodiment 1, and a material of a rigid support plate 20 is the same as the material in Embodiment 1. Details are not described herein again. In this embodiment, only a structure of the rigid support plate 20 changes.

The change in the rigid support plate 20 in this application is that a structure of at least one mounting surface is formed by a boss disposed on the rigid support plate 20. To be specific, at least one boss is disposed on the rigid support plate 20, and a top surface of each boss is one of the mounting surfaces. In other words, mounting surfaces are disposed at different heights by disposing a boss on the rigid support plate 20. A quantity of bosses may be the same as or different from a quantity of mounting holes, and may be specifically set based on an actual situation. The following describes the boss by using an example.

As shown in FIG. 5, FIG. 5 is a cutaway drawing of a camera substrate assembly having two mounting holes according to an embodiment of this application. In this application, as shown in FIG. 5, a first boss 25 inserted into a first mounting hole 11 is disposed on the rigid support plate 20. A top surface of the first boss 25 is a first mounting surface 21. A second boss 26 inserted into a second mounting hole 12 is also disposed on the rigid support plate 20. A top surface of the second boss 26 is a second mounting surface 22. It can be learned from FIG. 5 that a height difference between the first mounting surface 21 and the second mounting surface 22 is determined by a height of the first boss 25 and a height of the second boss 26. In an actual disposition, the height of the first boss 25 and the height of the second boss 26 may be adjusted based on a requirement to dispose the first mounting surface 21 and the second mounting surface 22 with different height differences.

Figure 6:
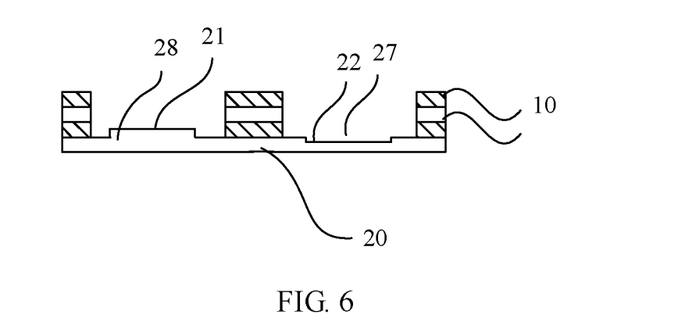
FIG. 6 is a cutaway drawing of a camera substrate assembly according to this application.

As shown in FIG. 6, FIG. 6 is a cutaway drawing of a camera substrate assembly having two mounting holes according to an embodiment of this application. In this application, as shown in FIG. 6, a third boss 28 inserted into a first mounting hole 11 is disposed on a rigid support plate 20. A top surface of the third boss 28 is a first mounting surface 21. A third groove 27 correspondingly connected to a second mounting hole 12 is also disposed on the rigid support plate 20. A bottom surface of the third groove 27 is a second mounting surface 22. In an actual disposition, a height of the third boss 28 and a depth of the third groove 27 may be adjusted based on an actual requirement to meet a requirement of a height difference between the first mounting surface 21 and the second mounting surface 22.

Figure 7:
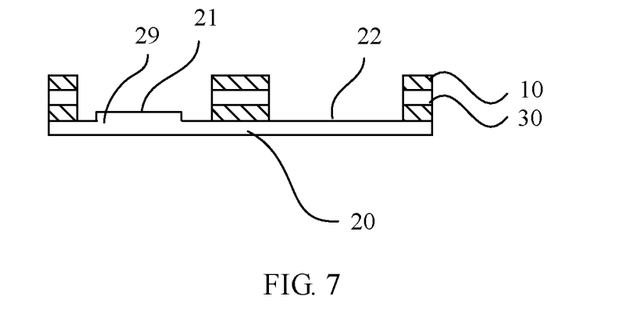
FIG. 7 is a cutaway drawing of a camera substrate assembly according to this application.

Alternatively, a structure shown in FIG. 7 is used. FIG. 7 is a cutaway drawing of a camera substrate assembly having two mounting holes according to an embodiment of this application. In FIG. 7, a fourth boss 29 inserted into a first mounting hole 11 is disposed on a rigid support plate 20. A top surface of the fourth boss 29 is a first mounting surface 21. A second mounting surface 22 is a surface that is of the rigid support plate 20 and that faces a second mounting hole 12. In other words, the second mounting surface 22 is flush with the surface that is of the rigid support plate 20 and that faces the second mounting hole 12.

It can be learned from the foregoing description that, in this embodiment, bosses and grooves at different heights are disposed to adapt to a change in fields of view of different lenses 60 and a change in thicknesses of different camera chips.

It should be understood that, in this embodiment of this application, when a quantity of mounting holes is changed, for example, when there are three, four, or five mounting holes, a quantity of bosses may also be changed correspondingly. In other words, the mounting surfaces are adjusted by disposing a boss or a groove to adapt to the change in the fields of view of different lenses 60 and the change in thicknesses of the camera chips.

In a specific implementation solution, a boss and the rigid support plate 20 are an integrated structure. The integrated structure is used to improve strength of the entire structure. In an actual disposition, a boss structure is formed on the rigid support plate 20 in a cutting manner or a grinding manner.

It can be learned from the descriptions in Embodiment 1 and Embodiment 2 that there is a height difference between mounting surfaces facing different mounting holes on the camera substrate assembly provided in the embodiments, so that the substrate assembly can be applied to different scenarios. The heights of the mounting surfaces are adjusted to adapt to the change in the fields of view of different lenses 60 and the change in thicknesses of different camera chips.

In addition, the camera substrate assembly provided in the embodiments of this application uses the mounting holes disposed on the printed circuit board 10 and the mounting surfaces disposed on the rigid support plate 20 to support cameras. This avoids impact of warpage on camera mounting when the printed circuit board 10 and the flexible circuit board 30 are laminated, and improves flatness after camera mounting, thereby improving a shooting effect of a camera module.

Figure 8:
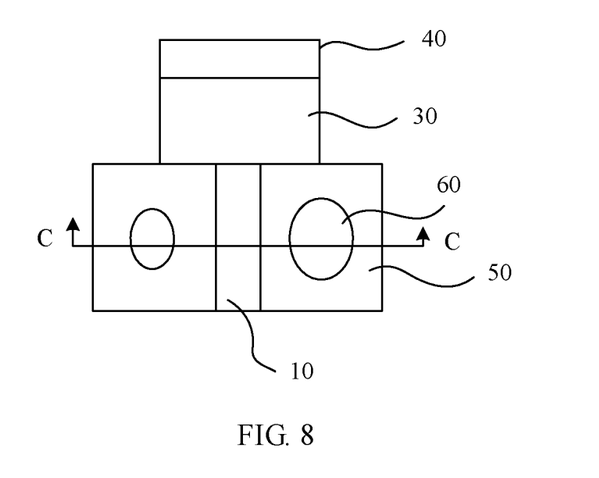
FIG. 8 is a schematic structural diagram of a camera module according to this application.
Figure 9:
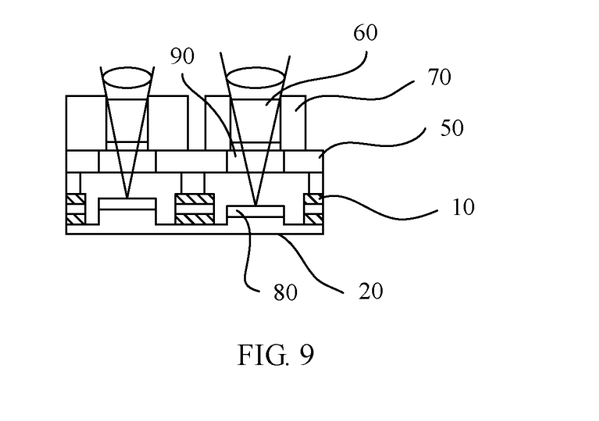
FIG. 9 is a cutaway drawing of C-C in FIG. 8.

As shown in FIG. 8 and FIG. 9, FIG. 8 is a schematic structural diagram of a camera module according to an embodiment of this application, and FIG. 9 is a cutaway drawing of a camera module according to an embodiment of this application.

This application further provides a camera module. The camera module includes the camera substrate assembly according to any one of the foregoing embodiments, and further includes a camera chip 80 disposed on a mounting surface in each mounting hole. Each camera chip 80 is signal-connected to a printed circuit board 10. The camera module further includes:

a lens mount 50 fixedly connected to the printed circuit board 10, where a light filter is disposed on the lens mount 50; and a lens 60 and a drive motor 70 that drives the lens 60 to zoom in or zoom out, where an optical axis of the lens 60 and an axis of the light filter 90 are coaxial.

Continuing to refer to FIG. 9, the lens mount 50 provided in this application covers a side on which the camera chip 80 is disposed on a printed circuit substrate assembly, and the light filter 90 is disposed on the lens mount 50. The lens 60 and the drive motor 70 that drives the lens 60 to zoom in or zoom out are disposed on the lens mount 50. In addition, in a specific disposition, the light filter 90 and the lens 60 share an axis, and the axis passes through a sensing device of the camera chip 80, so that light passing through the lens 60 can be transmitted to the camera chip 80.

In the embodiment, the mounting holes disposed on the printed circuit board 10 and the mounting surfaces disposed on the rigid support plate 20 are used to support cameras. This avoids impact of warpage on camera mounting when the printed circuit board 10 and the flexible circuit board 30 are laminated, and improves flatness after camera mounting, thereby improving a shooting effect of the camera module. In addition, the camera chip 80 is directly packaged on a mounting surface of the rigid support plate 20. This effectively increases a distance (back focal length (BFL)) between the bottom of the lens 60 and a surface of the camera chip 80, reduces an imaging probability of dust and improves a yield.

In a specific implementation solution, each camera chip 80 is signal-connected to the printed circuit board 10 by using a metallic wire. The camera chip 80 is bonded to and packaged on a structure of a metal support plate. A surface of the camera chip 80 is below or is flush with a surface of the printed circuit board 10. Metallic wire bonding for connection from the camera chip 80 to the printed circuit board 10 can lower an arc of the metallic wire, thereby reducing a risk that the lens mount 50 touches the metallic wire in a subsequent packaging process.

This application further provides a terminal device. The terminal device includes the foregoing camera module.

The terminal device is a common terminal device such as a mobile phone or a tablet computer. On the terminal device, mounting holes disposed on a printed circuit board 10 and mounting surfaces disposed on a rigid support plate 20 are used to support cameras. This avoids impact of warpage on camera mounting when the printed circuit board 10 and a flexible circuit board 30 are laminated, and improves flatness after camera mounting, thereby improving a shooting effect of the camera module.

Although some example embodiments of the present invention have been described, persons skilled in the art can make changes and modifications to these embodiments once they learn the basic inventive concept. Therefore, the following claims are intended to be construed as to cover the example embodiments and all changes and modifications falling within the scope of the present invention.

Obviously, persons skilled in the art can make various modifications and variations to this application without departing from the spirit and scope of this application. This application is intended to cover these modifications and variations provided that they fall within the scopes of the claims of the present invention and their equivalent technologies.

What is claimed is:

1. A camera substrate assembly, comprising:
   a rigid support plate;
   a printed circuit board;
   a flexible circuit board disposed between two plates of the printed circuit board, wherein the rigid support plate, the printed circuit board, and the flexible circuit board are laminated, wherein at least two mounting holes configured to accommodate camera chips are disposed on the printed circuit board and passing through the flexible circuit board, wherein the rigid support plate has mounting surfaces that face the at least two mounting holes, wherein a groove is formed on the rigid support plate, and wherein a bottom surface of the groove is one of the mounting surfaces of the rigid support plate and configured to support the camera chips;
   a height difference between the mounting surfaces facing different mounting holes; and
   a boss disposed on the rigid support plate, wherein a top surface of the boss is one of the mounting surfaces.

2. The camera substrate assembly of claim 1, wherein the groove is coupled to one of the at least two mounting holes, and wherein a mounting surface of the rigid support plate that faces another one of the at least two mounting holes is flush with a surface of the rigid support plate facing the printed circuit board.

3. The camera substrate assembly of claim 1, wherein the boss is inserted into one of the at least two mounting holes when only a boss structure is disposed on the rigid support plate, and wherein a mounting surface of the rigid support plate that faces another one of the at least two mounting holes is flush with a surface of the rigid support plate facing the printed circuit board.

4. The camera substrate assembly of claim 1, wherein the boss and the rigid support plate are an integrated structure.

5. The camera substrate assembly of claim 1, wherein the rigid support plate is a metal support plate.

6. The camera substrate assembly of claim 5, wherein the metal support plate is a steel plate.

7. The camera substrate assembly of claim 5, wherein the metal support plate is an alloy plate.

8. The camera substrate assembly of claim 1, wherein the flexible circuit board is signal-connected to the printed circuit board and a connector.

9. The camera substrate assembly of claim 1, wherein flatness of the mounting surfaces is less than a specified threshold, and wherein the specified threshold is from five to ten micrometers (μm).

10. The camera substrate assembly of claim 1, wherein the height difference is adjusted to change in thicknesses of different camera chips.

11. The camera substrate assembly of claim 1, wherein the height difference is adjusted to change in fields of view of different lenses.

12. A camera apparatus, comprising:
    a camera substrate assembly, comprising:
      a rigid support plate;
      a printed circuit board;
      a flexible circuit board disposed between two plates of the printed circuit board, wherein the rigid support plate, the printed circuit board, and the flexible circuit board are laminated,
      wherein at least two mounting holes configured to accommodate camera chips are disposed on the printed circuit board and passing through the flexible circuit board,
      wherein the rigid support plate has mounting surfaces that face the at least two mounting holes, wherein a groove is formed on the rigid support plate, wherein a bottom surface of the groove is one of the mounting surfaces of the rigid support plate and configured to support the camera chips,
      wherein strength of the rigid support plate is greater than strength of the printed circuit board, and
      wherein flatness of the mounting surfaces is less than a specified threshold;
      a height difference between the mounting surfaces facing different mounting holes; and
      a boss disposed on the rigid support plate, wherein a top surface of the boss is one of the mounting surfaces;
    a camera chip disposed on a mounting surface in each mounting hole, wherein each camera chip is signal-connected to the printed circuit board;
    a lens mount fixedly coupled to the printed circuit board, wherein a light filter is disposed on the lens mount;
    a lens coupled to the lens mount, wherein an optical axis of the lens and an axis of the light filter are coaxial; and
    a drive motor configured to drive the lens to zoom in or zoom out.

13. The camera apparatus of claim 12, wherein each camera chip is signal-connected to the printed circuit board using a metallic wire.

14. The camera apparatus of claim 12, wherein the groove is formed on the rigid support plate in an etching manner or a cutting manner.

15. The camera apparatus of claim 12, wherein the light filter and the lens share an axis, and wherein the axis passes through a sensing device of the camera chip.

16. A terminal device, comprising a camera apparatus comprising:
    a camera substrate assembly, comprising:
      a rigid support plate;
      a printed circuit board;
      a flexible circuit board disposed between two plates of the printed circuit board, wherein the rigid support plate, the printed circuit board, and the flexible circuit board are laminated, wherein at least two mounting holes configured to accommodate camera chips are disposed on the printed circuit board and passing through the flexible circuit board, wherein the rigid support plate has mounting surfaces facing the at least two mounting holes, wherein a groove is formed on the rigid support plate, and wherein a bottom surface of the groove is one of the mounting surfaces of the rigid support plate and configured to support the camera chips;
      a height difference between the mounting surfaces facing different mounting holes; and
      a boss disposed on the rigid support plate, wherein a top surface of the boss is one of the mounting surfaces;
    a camera chip disposed on a mounting surface in each mounting hole, wherein each camera chip is signal-connected to the printed circuit board;

a lens mount fixedly coupled to the printed circuit board, wherein a light filter is disposed on the lens mount;

a lens coupled to the lens mount, wherein an optical axis of the lens and an axis of the light filter are coaxial; and a drive motor configured to drive the lens to zoom in or zoom out.

17. The terminal device of claim 16, wherein the rigid support plate is a metal support plate.

18. The terminal device of claim 17, wherein the metal support plate comprises a steel plate, an alloy plate, an aluminum plate, or an iron plate.

19. The terminal device of claim 16, wherein the groove is formed on the rigid support plate in an etching manner or a cutting manner.

20. The terminal device of claim 16, wherein the strength of the rigid support plate is greater than strength of the printed circuit board.

* * * * *